United States Patent [19]

Nimmersjö

[11] Patent Number: 4,797,805
[45] Date of Patent: Jan. 10, 1989

[54] FAULT LOCATION IN A POWER SUPPLY NETWORK

[75] Inventor: Gunnar Nimmersjö, Västerås, Sweden

[73] Assignee: Asea Aktiebolag, Västerås, Sweden

[21] Appl. No.: 942,990

[22] Filed: Dec. 18, 1986

[30] Foreign Application Priority Data

Dec. 20, 1985 [SE] Sweden .............................. 8506061-4

[51] Int. Cl.$^4$ ..................... G06F 15/20; G06F 15/56
[52] U.S. Cl. ................................ 364/481; 324/509; 324/522; 361/44; 364/483; 364/492; 364/495
[58] Field of Search ............... 364/483, 481, 492, 495, 364/500, 578, 582; 324/509, 521, 522, 534; 361/42, 44, 65

[56] References Cited

U.S. PATENT DOCUMENTS

| | | | |
|---|---|---|---|
| 4,281,386 | 7/1981 | Kondow et al. | 324/522 |
| 4,455,612 | 6/1984 | Girgis et al. | 364/483 |
| 4,466,071 | 8/1984 | Russell et al. | 364/492 |
| 4,529,929 | 7/1985 | Berggren | 324/509 |
| 4,559,491 | 12/1985 | Saha | 364/483 |
| 4,570,231 | 12/1986 | Bunch | 364/492 |
| 4,591,992 | 5/1986 | Yamaura | 364/483 |
| 4,689,709 | 8/1987 | Isahaya | 364/483 |

Primary Examiner—Parshotam S. Lall
Assistant Examiner—Kevin J. Teska
Attorney, Agent, or Firm—Watson, Cole, Grindle & Watson

[57] ABSTRACT

A method for location of a fault on a transmission line in a network for distribution and transmission of electric power uses a travelling wave model of the transmission line positioned in measuring stations (P, Q) at either end of the transmission line, to obtain the voltage distribution along the transmission line, seen from both station P and station Q. A voltage $\Delta U_{Qp}$ is generated as the difference between the voltage in station P, calculated in the travelling wave model in station Q, and the corresponding voltage one period/half period earlier. A voltage $\Delta U_{Pp}$ is generated as the difference between the voltage, calculated in the travelling wave model in station P, and the corresponding voltage one period/half period earlier. The corresponding voltage differences $\Delta U_{Pp}$ and $\Delta U_{Qq}$ are calculated for station Q. The voltage difference $\Delta P$ is then generated as the difference between $\Delta U_{Qp}$ and $\Delta U_{Pp}$ and the corresponding voltage difference $\Delta Q$ is generated as the difference between $\Delta U_{Pq}$ and $\Delta U_{Qq}$. The fault distance PF is then obtained as $PF = \Delta P \cdot PQ/(\Delta P + \Delta Q)$, where PQ is the distance between the stations.

11 Claims, 8 Drawing Sheets

FAULT LOCATION IN A POWER SUPPLY NETWORK

TECHNICAL FIELD

The present invention relates to a method and equipment for locating a fault in a power line network for distribution and transmission of electric power, in which the supply of power to the power line that is to be protected takes place at least substantially from one of the end points of the line and in which that part of the network that is to be protected is provided with measuring devices in a station or the like at either end of the line section to be protected.

Multiphase distribution and transmission networks have to be protected against ground faults and faults occurring between the phases in such a way that a faulty component or line is automatically disconnected with the aid of its circuit breaker. This is necessary for minimizing the risk of personal injury and fire.

It is also very important, after a fault has occurred and has been detected, to be able to eliminate the fault. This presupposes fast methods for locating the point on the transmission line where the fault has occurred. The present invention relates to a method and a device for solving this problem.

BACKGROUND ART

A method for fault location must necessarily be preceded by some form of detection of the fault. A detection can take place in many different ways which will not be described here, with the exception of the special method of detection which is a condition for the method and the device for fault location according to this invention. This detection will be described in connection with the disclosure of the present invention.

Concerning fault location on a transmission line, a plurality of different known methods exist.

One such method is known from British patent application No. 2,036,478A. This describes a method by which a location for a fault is assumed and, under simplified assumptions of the parameters of the network, the current and voltage at the assumed fault location are determined. The determinations are repeated at different assumed locations until the determined current and the voltage have the same phase, which means that the fault point has been correctly located.

Another method is described in U.S. Pat. No. 4,559,491 (Saha). This publication relates to a method for fault location on a section of a three-phase power line. After measurement of currents and voltages at one end of the section, the type of fault is first determined and thereafter certain parameters in an equation system are determined. The equation system used provides relationships between the complex values of the impedance of the section, the impedances of the networks of the near end and of the remote end of the section, and measured currents and voltages while eliminating fault resistance, zero sequence components, etc. Solving the equation system gives the distance from the end point of the section to the location of the fault in question.

In an invention described in U.S. application Ser. No. 743,930, filed on June 12th 1985 now U.S. Pat. No. 4,719,580 in the name of Nimmersjö, a method and a device for locating a fault are described, which is based on voltage waves emanating from a measuring point towards the fault location and corresponding waves reflected from the fault location, which waves are included in a travelling wave model of the transmission line. The invention described in this earlier application comprises carrying out, at certain specified time intervals, a measurement of the instantaneous values of the current and voltage at the end point of the transmission line, for example in a station. With these measured values and with the aid of the travelling wave model, the voltage at a number of control points along the transmission line can be calculated. If the transmission line is energized and the calculated control voltages at two consecutive control points constantly have different signs, there is a fault on the transmission line between these points. Starting from the distance between the points in question and the calculated control voltages, the location of the fault can be determined by interpolation.

It is the travelling wave model described in the above-noted prior application that forms the basis for the fault location method and equipment according to the present invention which is hereby incorporated by reference.

SUMMARY OF THE INVENTION

In its method aspect, the invention relates to a method for locating a fault on an electrical power line extending between a first and a second station included in a power transmission system, in which at each end point of the line, measurement is made of the instantaneous values of the current flowing in the line and the voltage of the line which values are converted into corresponding digital values and are supplied to a travelling wave model of the line in each respective station to produce the instantaneous voltage distribution along the transmission line, seen both from the first and from the second station. The method is characterised in that in each station a measurement is made of the difference between the present line voltage and the line voltage at an immediately preceding time and when a fault is indicated by the measured difference exceeding a pre-set threshold value in either station, in that a first value is generated in the first station representing the difference between the voltage in the second station, calculated in the travelling wave model in the first station with values of the currents and voltages measured in the first station and the corresponding voltage at an immediately preceding time. Furthermore a similar second value is generated in the second station for the first station using the travelling wave model in the second station, and in that one of said first and second values is transmitted to the station in which it was not generated and used there in digital form to compute where the fault lies on the line relative to the said station.

BRIEF DESCRIPTION OF THE DRAWINGS

The invention will now be described, by way of example, with reference to the accompanying drawings, in which.

THEORETICAL BACKGROUND OF THE INVENTION

Figure 1:
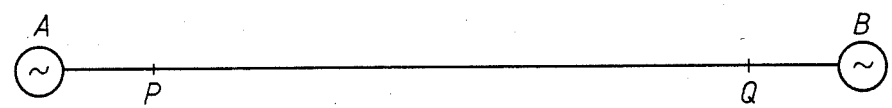
FIG. 1 shows a faultless power line extending between two stations P and Q which are supplied from two power sources A and B.

FIG. 1 shows a power transmission line extending between two stations or measuring points P and Q. In the example shown, the line is fed at each end from a respective power source A or B.

Figure 2:
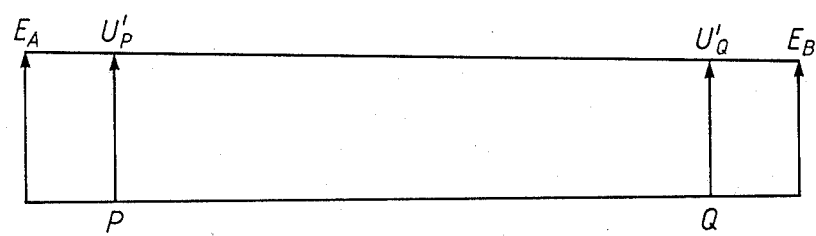
FIG. 2 is a graph showing the real measured voltage distribution along the line according to FIG. 1 between the power sources A and B.

FIG. 2 shows graphically the real voltage distribution along the transmission line of FIG. 1 in its faultless state. $E_A$ and $E_B$, respectively, are the E.M.F. of the respective power source, and $U'_P$ and $U'_Q$, respectively, are the voltage measured at P and at Q, respectively.

Figure 3:
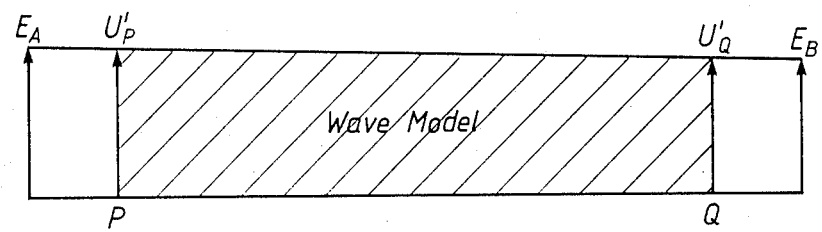
FIG. 3 is a graph showing the voltage distribution of FIG. 2 created by superposing one travelling wave model based on station P and one based on station Q and with voltage and current values measured in station P and in station Q.

In the above-mentioned U.S. Pat. No. 4,719,580 is described how a travelling wave model of a transmission line can be used for calculating the voltage distribution along that line. With the aid of the current and voltage values measured in stations P and Q, it is therefore possible to determine, using the travelling wave model, what will be the voltage distribution along the transmission line from station P towards station Q and from station Q towards station P, respectively, in a faultless state. The result of such calculations is shown in FIG. 3 and it can be seen that the same voltage distribution is obtained as in FIG. 2 within the limits set by measurement errors in measured values and by uncertain knowledge of parameters.

In an ideal transmission system, the zero sequence voltage and the negative sequence voltage are zero in the faultless case. In practice, they can be assumed to be small. This is particularly true of that part of the zero sequence voltage and the negative sequence voltage which is generated by asymmetry in the monitored transmission line. The voltage change which arises as a result of a fault may either be conceived to be that difference voltage ΔU which, in accordance with the Helmhortz-Thévenin theorem, arises at the different points of the network because of the fault, or only the zero sequence or negative sequence component of this change. The conclusions drawn are valid for all interpretations of ΔU. Thus, in the faultless case, ΔU=0 at all measuring points.

Figure 4:
FIG. 4 shows the power line of FIG. 1 but with a fault located at F between stations P and Q.
Figure 5:
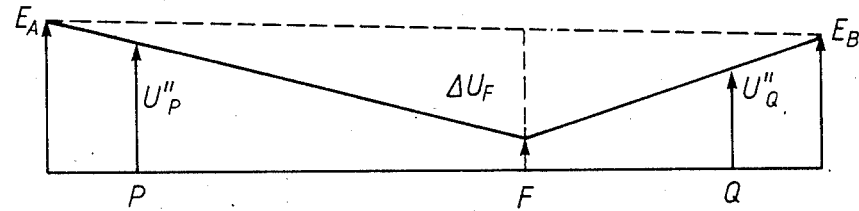
FIG. 5 is a graph showing the real measured voltage along the line according to FIG. 4 after the occurrence of a high resistance fault at F.

When the transmission line shown in FIG. 1 is subjected to an internal fault, that is, a fault located between the measuring points P and Q (see FIG. 4), a real voltage distribution is obtained as shown in FIG. 5. The greatest voltage change $\Delta U_F$ occurs at the fault point F. The real measured voltage at the points P and Q are now represented as $U''_P$ and $U''_Q$. In the following description the sign ' will indicate the value of a quantity prior to the occurrence of a fault and the sign " the value of a quantity after the occurrence of a fault. Further, in order to describe the invention, an indexing system defining the quantities in question is needed.

An index containing P indicates that the quantity in question has been determined with values measured at the measuring point P.

An index containing Q indicates that the quantity in question has been determined with values measured at the measuring point Q.

An index containing p indicates that the value of the quantity in question is calculated for the point P.

An index containing q indicates that the value of the quantity in question is calculated for the point Q.

This means, for example, that $U_{Pq}$ indicates a voltage at Q calculated with values measured at P.

With the aid of this system, the following difference voltages will now be defined:

$$\Delta U_{Pp} = U'_P - U''_P \tag{1}$$

$$\Delta U_{Qq} = U'_Q - U''_Q \tag{2}$$

$$\Delta U_{Pq} = U'_{Pq} - U''_{Pq} \tag{3}$$

$$\Delta U_{Qp} = U'_{Qp} - U''_{Qp} \tag{4}$$

The zero sequence component in the changes is obtained by forming the sum of the phase voltages $U'_R$, $U'_S$ and $U'_T$. Prior to a fault, $U''_{RF} + U''_S + U''_T = 0$, and a simple calculation of $(\Delta U_{Pp})_0$, $(\Delta U_{Qq})_0$, $(\Delta U_{Pq})_0$ and $(\Delta U_{Qp})_0$ in all these cases is obtained since $(\Delta U)_0 = U'_0 = U'_R + U'_S + U'_T$.

The negative sequence component can be obtained by means of some known type of negative sequence filter.

Figure 6:
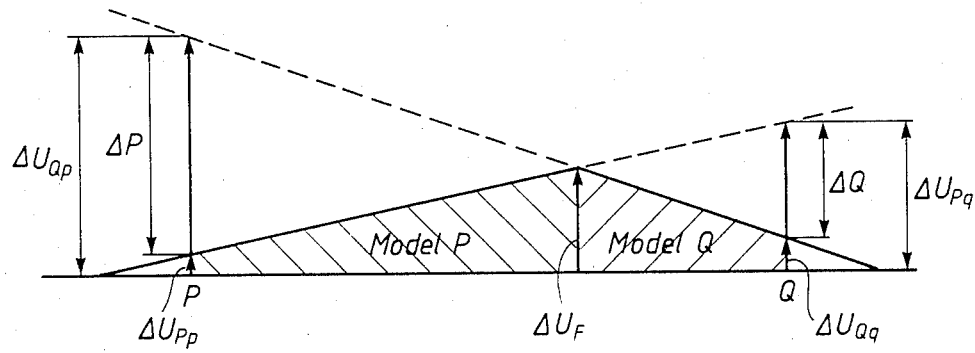
FIG. 6 is a graph showing along the line of FIG. 4 the voltage differences ΔU between the measured or calculated voltage prior to the fault and the voltage calculated with the travelling wave model after the fault appeared at F.

In FIG. 6 the voltage differences according to equations (1), (2), (3) and (4) are plotted graphically. It can be determined that a device at P for calculating the voltage distribution from P towards Q has a line model which is correct between P and F but incorrect at point F, and therefore the calculated voltage distribution is incorrect in the region between F and Q. In similar manner, a device at Q provides a correct picture of the voltage distribution between Q and F but an incorrect distribution for the region FP. The two devices jointly give a correct distribution of the voltage divided between PF for the device at P and QF for the device at Q. F is the only point for which the two devices give the same model voltage.

The voltage differences $\Delta P$ and $\Delta Q$, as they are represented in FIG. 6, that is, $$\Delta P = \Delta U_{Qp} - \Delta U_{Pp} \tag{5}$$

$$\Delta Q = \Delta U_{Pq} - \Delta U_{Qq} \tag{6}$$

can now be utilized for ground fault indication, since in a faultless state both $\Delta P$ and $\Delta Q$ will be zero. $\Delta P$ constitutes an error in measurement at Q concerning the voltage change at P, and $\Delta Q$ constitutes an error in measurement at P concerning the voltage at Q because the models in the case of a fault at F are not correct for the whole transmission line. $\Delta P$ and $\Delta Q$ can therefore be referred to as model fault voltages which are always zero if the real transmission line and the model are in agreement.

For calculating $\Delta P$ and $\Delta Q$ in equations (5) and (6), the mean value, the R.M.S. or the peak value of the difference voltage can be utilized.

The method and the device for fault location according to the invention are based on an evaluation of the model fault voltages $\Delta P$ and $\Delta Q$. When $\Delta P$ and $\Delta Q$ are not zero, this means that a fault has occurred. On the basis of the geometry in FIG. 6, the fault can be located in simple manner. If the distance between P and Q is designated PQ, the fault distance from P to the fault point F can be calculated as follows:

$$PF = \frac{\Delta P}{\Delta P + \Delta Q} PQ \tag{7}$$

With the aid of the voltage differences described, a fault located behind a measuring point can also be detected in a simple manner. In the case of measuring point P, a fault located behind relates to a fault between the power source A and the point P, and in the case of measuring point Q a fault located behind relates to a fault between the power source B and the point Q.

Figure 7:
FIG. 7 shows the power line of FIG. 1 when a fault F arises between station P and the power source A.
Figure 8:
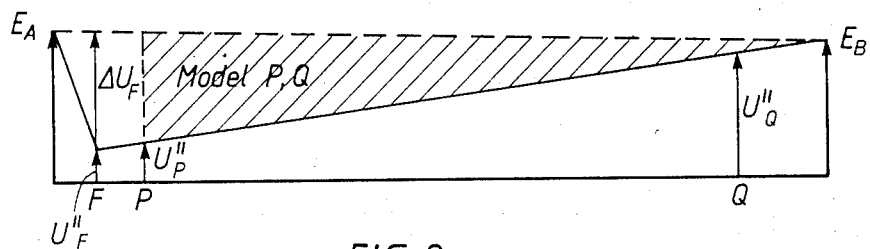
FIG. 8 is a graph showing the real measured or calculated voltage distribution along the line of FIG. 7 when the fault shown in FIG. 7 has occurred.
Figure 9:
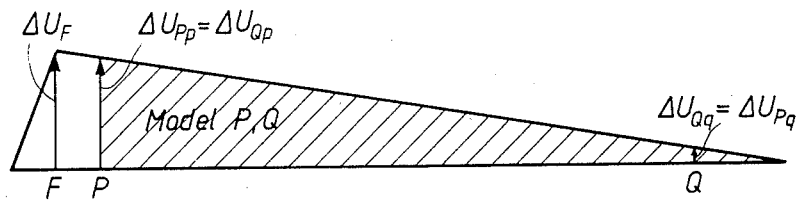
FIG. 9 is a graph showing along the line of FIG. 7 the voltage differences ΔU between the measured or calculated voltage prior to the fault and the voltage calculated with the travelling wave model after the fault F shown in FIG. 7 appeared.

If a fault occurs between A and P as shown in FIG. 7, a real voltage distribution is obtained according to FIG. 8. The distribution of the voltage difference between P and Q, calculated with the travelling wave model, is clear from FIG. 9. It can be seen that the protection devices at P and Q provide the same voltage distribution for the whole transmission line, which means that for a fault located behind the measuring point in question the following relationships apply $$|\Delta U_{Pq}| - |\Delta U_{Qp}| = 0 \tag{8}$$

$$|\Delta U_{Qp}| - |\Delta U_{Pp}| = 0 \tag{9}$$

It can also be shown in a simple manner that equations (8) and (9) must be valid for a fault between B and Q. Distinguishing for a fault between A and P and between B and Q, respectively, is then that for a fault between A and P $$|\Delta U_{Pq}| - |\Delta U_{Pp}| < 0 \tag{10}$$

and for a fault between B and Q $$|\Delta U_{Pq}| - |\Delta U_{Pp}| > 0 \tag{11}$$

In the figures the distribution of the difference voltages along the transmission line have been drawn as straight lines. It can be proved that this is the case since the difference in argument for the complex impedances of the power sources and the line is small. This is a prerequisite for the fault location equation (7) which, however, gives good results also in the case of normal differences between the arguments of the sources and the line. This means that if the arguments are not too different only two calculated values from station Q, namely $\Delta U_{Qq}$ and $\Delta U_{Qp}$, need be transferred to station P.

A general and exact calculation method with arbitrary source impedances presupposes that three quantities are transferred via the data communications link which a constantly switched-in fault locator requires. The basis for the general case will be described below. The description is based on stationary conditions, that is, with complex currents and voltages. $\Delta I$ is defined as the stationary fault current which is superposed on the condition prevailing prior to the occurrence of the fault and constitutes the current flowing at the fault point. This current is distributed such that $K_{1P}\Delta I_1 = \Delta I_{1P}$ is the positive sequence component $K_{2P}\Delta I_2 = \Delta I_{2P}$ is the negative sequence component and $K_{0P}\Delta I_0 = \Delta I_{0P}$ is the zero sequence component of the current at the measuring point P. K is the distribution factor for the respective component of the current at the fault point.

$Z_{1A}$, $Z_{2A}$ and $Z_{0A}$ are source impedances seen from the measuring point P of the protection device.

$Z_1$ and $Z_0$ are the impedances ($Z_2 = Z_1$) of the transmission line for the distance PQ.

$U'$ is the voltage prevailing at the measuring point prior to a fault.

A single-phase ground fault in phase R is assumed to occur on the transmission line.

In this case, $\Delta I_1 = \Delta I_2 = \Delta I_0 = \Delta I$. For each phase the control voltages of the measuring point, after the occurrence of a fault, can be expressed as follows:

$$U_{RPp} = U'_{RPp} - \Delta I(K_{1P}Z_{1A} + K_{2P}Z_{2A} + K_{0P}Z_{0A}) \tag{12}$$

$$U_{SPp} = U'_{SPp} - \Delta I(a^2 K_{1P}Z_{1A} + a K_{2P}Z_{2A} + K_{0P}Z_{0A}) \tag{13}$$

$$U_{TPp} = U'_{TPp} - \Delta I(a K_{1P}Z_{1A} + a^2 K_{2P}Z_{2A} + K_{0P}Z_{0A}) \tag{14}$$

The calculated control voltages for the remote end point are as follows:

$$U_{RPq} = U'_{RPq} - \Delta I[K_{1P}(Z_{1A}+Z_1) + K_{2P}(Z_{2A}+Z_1) + K_{0P}(Z_{0A}+Z_0)] \tag{15}$$

$$U_{SPq} = U'_{SPq} - \Delta I[a^2 K_{1P}(Z_{1A}+Z_1) + a K_{2P}(Z_{2A}+Z_1) + K_{0P}(Z_{0A}+Z_0)] \tag{16}$$

$$U_{TPq} = U'_{TPq} - \Delta I[a K_{1P}(Z_{1A}+Z_1) + a^2 K_{2P}(Z_{2A}+Z_1) + K_{0P}(Z_{0A}+A_0)] \tag{17}$$

During the filtration in order to obtain the voltage change, $U'$ disappears, and for the first period or half-period after a fault, depending on how the filtration is performed, the following relationships are valid:

$$\Delta U_{RPp} = -\Delta I(K_{1P}Z_{1A} + K_{2P}Z_{2A} + K_{0P}Z_{0A}) \tag{18}$$

$$\Delta U_{SPp} = -\Delta I(a^2 K_{1P} Z_{1A} + a K_{2P} Z_{2A} + K_{0P} Z_{0A}) \quad (19)$$

$$\Delta U_{TPp} = -\Delta I(a K_{1P} Z_{1A} + a^2 K_{2P} Z_{2A} + K_{0P} Z_{0A}) \quad (20)$$

and $$\Delta U_{RPq} = -\Delta I[K_{1P}(Z_{1A} + Z_1) + K_{2P}(Z_{2A} + Z_1) + K_{0P}(Z_{20} + Z_0)] \quad (21)$$

$$\Delta U_{SPq} = -\Delta I[a^2 K_{1P}(Z_{1A} + Z_1) + a K_{2P}(Z_{2A} + Z_1) + K_{0P}(Z_{0A} + Z_0)] \quad (22)$$

$$\Delta U_{TPq} = -\Delta I[a K_{1P}(Z_{1A} + Z_1) + a^2 K_{2P}(Z_{2A} + Z_1) + K_{0P}(Z_{0A} + Z_0)] \quad (23)$$

The zero sequence change and also the negative sequence change, that is, one-third of the sum voltage, are of special interest to ground fault detection. Since $U_0 = 0$ may be assumed to be valid prior to a fault, its occurrence implies that there is a fault in the network. Thus, in addition to the generation of the sum of the phase voltages, no special filtering to obtain $\Delta U_0$ is needed, and $\Delta U_0 = 0$ prior to a fault. If $K_{0P} \Delta I = \Delta I_{0P}$ is used, the sum voltage can be expressed as:

$$\Delta U_{0Pq} = \sum_{RST} \Delta U_{iPq} = -3(Z_{0A} + Z_0) \cdot \Delta I_{0P} \quad (24)$$

and $$\Delta U_{0Pp} = \sum_{RST} \Delta U_{iPp} = -3 Z_{0A} \cdot \Delta I_{0P} \quad (25)$$

For the actual fault point, if the zero sequence impedance of PF is designated $Z_{0PF}$, the following sum voltage can be calculated:

$$\Delta U_{0Pf} = \sum_{RST} \Delta U_{iPf} = -3(Z_{0A} + Z_{0PF}) \cdot \Delta I_{0P} \quad (26)$$

If the corresponding calculations are made for a protection device at Q, the following relationships are obtained:

$$\Delta U_{0Qq} = \sum_{RST} \Delta U_{iQq} = -3(Z_{0B} + Z_0) \cdot \Delta I_{0Q} \quad (27)$$

$$\Delta U_{0Qq} = \sum_{RST} \Delta U_{iQp} = -3 Z_{0B} \cdot \Delta I_{0Q} \quad (28)$$

and $$\Delta U_{0Qf} = \sum_{RST} \Delta U_{iQf} = -3(Z_{0B} + Z_{0QF}) \cdot \Delta I_{0Q} \quad (29)$$

It is also possible to write:

$$\Delta U_{0Pq} = -3(Z_{0A} + Z_{0PF})\Delta I_{0P} - 3 Z_{0QF} \Delta I_{0P} = \Delta U_{0Pf} - 3 Z_{0QF} \Delta I_{0P} \quad (30)$$

$$\Delta U_{0Pp} = -3(Z_{0A} + Z_{0PF})\Delta I_{0P} + 3 Z_{0PF} \Delta I_{0P} = \Delta U_{0Pf} + 3 Z_{0PF} \Delta I_{0P} \quad (31)$$

and since $\Delta U_{0Pf} = \Delta U_{0Qf}$, the following relationships are obtained:

$$\Delta U_{0Qp} = \Delta U_{0Pf} - 3 Z_{0PF} \Delta I_{0Q} \quad (32)$$

and $$\Delta U_{0Qq} = \Delta U_{0Pf} + 3 Z_{0QF} \Delta I_{0Q} \quad (33)$$

Now, if the following equations are inserted $$\Delta P_0 = \Delta U_{0Qp} - \Delta U_{0Pp} \quad (34)$$

$$\Delta Q_0 = \Delta U_{0Pq} - \Delta U_{0Qq} \quad (35)$$

the equations 30–33 give $$\frac{\Delta P_0}{\Delta P_0 + \Delta Q_0} = \frac{Z_{0PF}}{Z_{0PF} + Z_{0QF}} \quad (36)$$

It can be noted that $\Delta P_0$ and $\Delta Q_0$ have the same arguments, since the impedance quotient in the righthand term of equation (36) is real. $Z_{0PF}$ and $Z_{0QF}$ have the same arguments since they are parts of the same line PQ. Given the simplified assumption that the complex impedances in the source and the line have the same arguments, the voltages $\Delta U_{0Qp}$, $\Delta U_{0Pq}$ and $\Delta U_{0Qq}$ will have the same phase angle, and the simplified calculation with mean values according to equations (5) to (7) can be used. This makes it possible to limit the data transmission to two mean values $|\Delta U_{Qq}|$ and $|\Delta U_{Qp}|$ from station Q to station P in order to evaluate the fault position on the transmission line as previously described. What is further required in the general case for an exact determination is another measured value for determining the phase angle $\gamma_q$ between $\Delta U_{Qp}$ and $\Delta U_{Qq}$.

The problem in the general case with arbitrary source impedances is that the mutual phase difference between the partial voltages at $\Delta P$ and $\Delta Q$ have to be determined before the amounts of $\Delta P$ and $\Delta Q$ can be determined. A general method, independent of the arguments of the source impedances, is obtained if, in addition to the above-mentioned calculated end point voltages, the difference voltages defined below are also utilized. The method then only uses peak values or mean values.

$$\Delta U_{0Ppq} = \Delta U_{0Pq} - \Delta U_{0Pp} \quad (37)$$

$$\Delta U_{0Qqp} = \Delta U_{0Qp} - \Delta U_{0Qq} \quad (38)$$

This exact determination thus presupposes, as previously described, that three quantities are transmitted via the data communications link which is required by a constantly switched-in fault locator.

Figure 10:
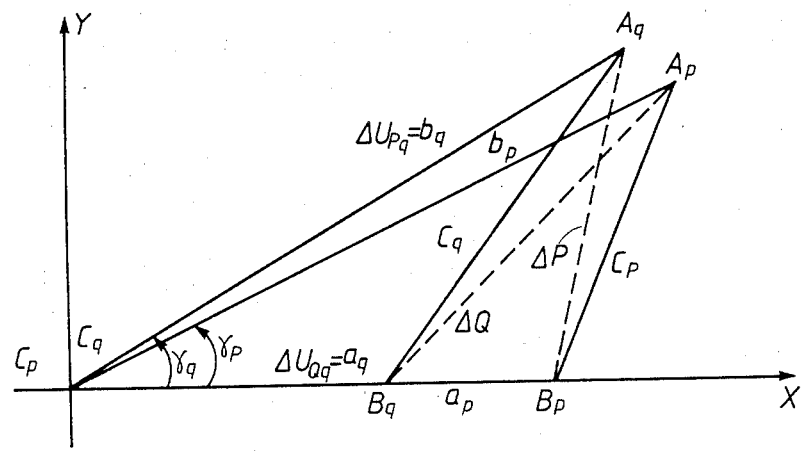
FIGS. 10 and 11 show the vectorial relationship between the voltage differences.
Figure 11:
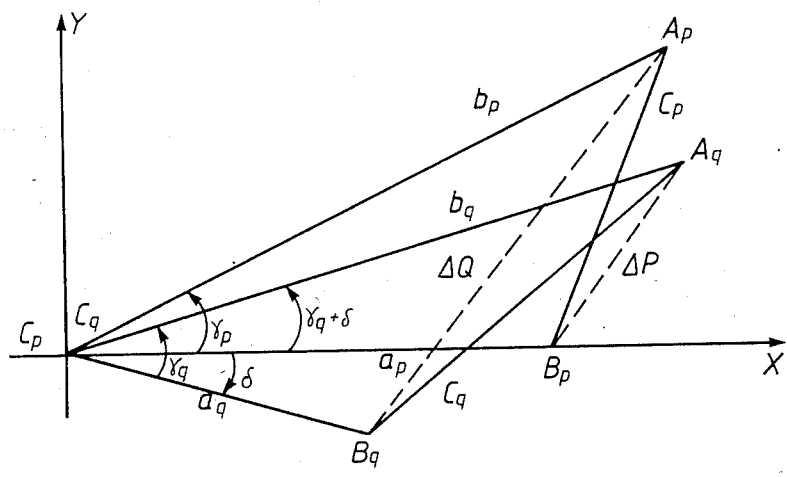

If, in order to simplify quantity designations and indexes for quantities locally calculated at P, the following equations are inserted $$|\Delta U_{0Pp}| = a_p \quad (39)$$

$$|\Delta U_{0Pq}| = b_p \quad (40)$$

$$|\Delta U_{0Ppq}| = c_p \quad (41)$$

and if for quantities locally calculated at Q, the following equations are inserted $$|\Delta U_{0Qq}| = a_q \quad (42)$$

$$|\Delta U_{0Qp}| = b_q \quad (43)$$

$$|\Delta U_{0Qqp}| = c_q \quad (44)$$

it will be clear from the vectorial relationship in FIGS. 10 and 11 that a, b and c constitute sides in triangles having corners $C_p$, $B_p$, $A_p$ and $C_q$, $B_q$, $A_q$, respectively, where the triangles have been placed in a right-angled system of coordinates xy with $C_p$ and $C_q$ at the origin of coordinates and with the sides $C_pB_p$ and $C_qB_q$ along the x-axis. Since now all the sides in the triangles are known, it is possible to determine all the angles in the triangles with the aid of the cosine theorem. Especially the angles $\gamma_p$ and $\gamma_q$, respectively, are determined from the equation $$\cos \gamma = \frac{a^2 + b^2 - c^2}{2ab} \quad (\gamma \geq 0) \tag{45}$$

From FIG. 10 the significance of $\Delta P$ and $\Delta Q$ is also clear. However, as has been shown in equation (36), in order to obtain correct $\Delta P$ and $\Delta Q$ values these must have the same arguments, that is, they must be parallel. For example, by turning the triangle $C_qB_qA_q$ through an angle $\delta$ so that $\Delta P$ and $\Delta Q$ become parallel, correct values of these quantities are obtained, which will be clear from FIG. 11.

For the corners $A_q$, $B_p$, $A_p$ and $B_q$ in FIG. 11, the following coordinates are valid:
$A_q$: $[b_q \cos (\gamma_q+\delta); b_q \sin (\gamma_q+\delta)]$
$B_p$: $[a_p; 0]$
$A_p$: $[b_p \cos (\gamma_p); b_p \sin (\gamma_p)]$
$B_q$: $[a_q \cos (\delta); a_q \sin (\delta)]$
The condition $\Delta P/\Delta Q$ can be expressed as follows:

$$\frac{b_p\sin(\gamma_p) - a_q\sin(\delta)}{b_p\cos(\gamma_p) - a_q\cos(\delta)} = \frac{b_q\sin(\gamma_q + \delta) - 0}{b_q\cos(\gamma_q + \delta) - a_p} \tag{46}$$

From this equation the angle $\delta$ can be solved, whereafter the coordinates for the corners of the triangles can be determined and the amounts $\Delta P$ and $\Delta Q$ be calculated.

With $$A = b_pb_q \sin (\gamma_p - \gamma_q) \tag{47}$$

$$B = a_pa_q - b_pb_q \cos (\gamma_p - \gamma_q) \tag{48}$$

and $$C = a_qb_q \sin \gamma_q - a_pb_p \sin \gamma_p \tag{49}$$

equation (46) can be expressed as follows:

$$A \cos \delta + B \sin \delta + C = 0 \tag{50}$$

This equation is simplified further and the following quadratic equation is obtained:

$$(C - A)\tan^2 \frac{\delta}{2} + (2B)\tan \frac{\delta}{2} + (A + C) = 0 \tag{51}$$

with the solutions (if $A^2 + B^2 - C^2 \geq 0$ and $A - C \neq 0$)

$$\delta = 2 \cdot \arctan \left[ \frac{B \pm \sqrt{A^2 + B^2 - C^2}}{A - C} \right] A \neq C \tag{52}$$

Of the two solutions, that solution is rejected which gives the vectors $B_pA_q$ and $B_qA_p$ opposite directions. The solution shall fulfil the condition:

$$[B_q \cos (\gamma_q+\delta)-a_p] \cdot [b_p \cos \gamma_p - a_q \cos \delta] \geq 0 \tag{53}$$

$$[b_q \sin (\gamma_q+\delta)] \cdot [b_p \sin \gamma_p - a_q \sin \delta] \geq 0 \tag{54}$$

$\Delta P$ and $\Delta Q$ can be calculated with the distance formula from analytical geometry:

$$\Delta P = \sqrt{[b_q\cos(\gamma_q + \delta) - a_p]^2 + [b_q\sin(\gamma_q + \delta)]^2} \tag{55}$$

$$\Delta Q = \sqrt{[b_p\cos\gamma_p - a_q\cos\delta]^2 + [b_q\sin\gamma_p - a_q\sin\delta]^2} \tag{56}$$

The fault distance PQ can then be calculated according to equation (7).

Since the mathematical model for calculating control voltages or the voltage distribution along the transmission line is a correct and accurate method within the limits determined by errors in measurement and the like, this also means a high accuracy in the fault location.

As stated above, the complete travelling wave model gives control voltages along the entire transmission line. However, as will have been clear from the disclosure of the invention, what is needed for the fault location is really only access to control voltages at the two end points calculated with measured values for the respective opposite end point on the protected transmission line, in addition to a communication link between P and Q. This means that it is also possible to use a simplified version of the travelling wave model and that the device for carrying out the method according to the invention will therefore be a considerably simpler device than if a complete voltage distribution has to be obtained.

The method and the device according to the invention can be applied to principal voltages, phase voltages as well as zero sequence and negative sequence voltages.

DESCRIPTION OF PREFERRED EMBODIMENTS

As will have been clear from the description of the method for location of a fault point, the starting-point is the same model fault voltages $\Delta P$ and $\Delta Q$ as are used for detection of a ground fault. In addition to comprising members for the actual evaluation of the fault distance between one of the stations and the fault point, a device for fault detection therefore comprises necessary members for generating the voltage differences $\Delta P$ and $\Delta Q$.

Figure 12:
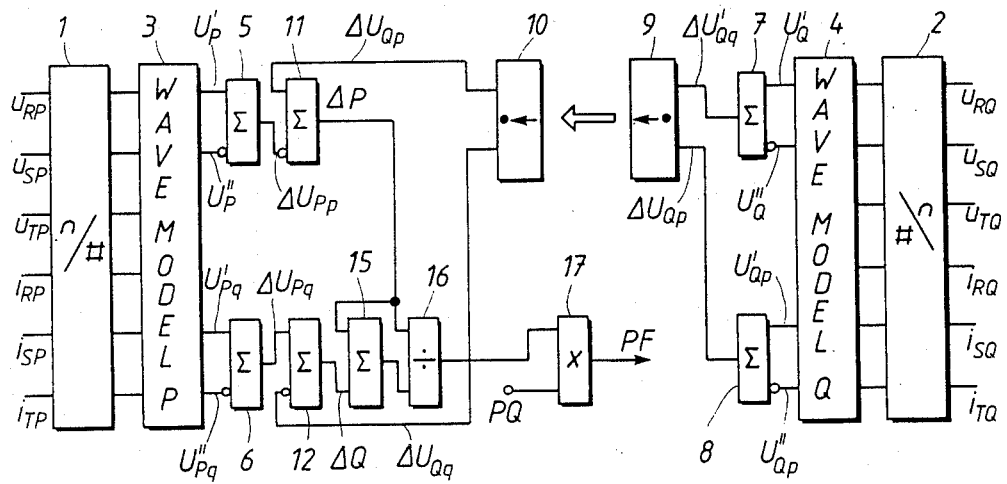
FIG. 12 shows an embodiment of a device according to the invention for location of a ground fault when the complex impedances of the power sources and the line have approximately equal arguments.

A device for carrying out the method according to the invention, in those cases where it can be assumed that the arguments for the complex impedances of the power sources and the transmission line are close to each other, is clear from FIG. 12. As will be clear from the above, this assumption permits the transmission of only two values from one station to the other.

Voltages and currents $u_{RP}$, $u_{SP}$, $u_{TP}$, $i_{RP}$, $i_{SP}$ and $i_{TP}$ measured in station P are converted from analog signals to corresponding digital ones in the measured value converter 1. The corresponding conversion of measured values in station Q takes place in converter 2. The digital measured values are each supplied to a respective travelling wave model 3 and 4.

As will be clear from the above description of the method, the fault location may take place with the aid of a phase voltage, a principal voltage or a negative or zero sequence voltage. Thus, the voltage values U delivered from the travelling wave model may be any one of these voltages. However, all of them must represent the same voltage; for example, all values U must be principal voltages.

The value of $U''_P$, which may be a mean value of the voltage in question during one period or during a half-period, is compared in the summation member 5 with $U'_P$, that is, the mean value of the same voltage measured for the preceding period or half-period. In stationary and faultless state, the difference $\Delta U_{Pp}$ becomes zero. When a new measured value for the next period/half-period becomes available, an existing $U''_P$ is transferred into a new $U'_P$ and the new measured value forms a new $U''_P$. This shifting and this updating take place continuously up to the point when a fault occurs, whereby $\Delta U_{Pp}$ acquires a value different from zero.

With the aid of voltage and current values measured at P, the voltage $U''_{Pq}$, that is, the voltage in station Q, can be calculated with the travelling wave model. In similar manner, the value of $U'_{Pq}$, that is, the value one period/half-period earlier, can be calculated. These two values are compared with each other in the summation member 6, whereby the difference or sum $\Delta P_{Pq}$ is generated.

To be able to use equations (5) and (6), to generate the differences $\Delta P$ and $\Delta Q$, the values of $\Delta U_{Qq}$ and $\Delta U_{Qp}$ must be available in station P. Value transmission is performed via a transmitter 9 and a receiver 10. The calculations may, of course, take place in station Q, in which case the values of $\Delta U_{Pp}$ and $\Delta U_{Pq}$ must be transmitted from station P to station Q.

The value of the model fault voltage $\Delta P$ is now generated in accordance with equation (5) in a summation member 11 and the corresponding value of $\Delta Q$ is generated in a summation member 12. According to the description of the method for the fault location, it is possible, with access to the values of $\Delta P$ and $\Delta Q$ and knowledge of the length PQ of the protected transmission line, to determine the distance between station P and the fault point using equation (7).

The sum of $\Delta P$ and $\Delta Q$ is generated in a summation member 15. $\Delta P$ is then divided by the sum of $\Delta P$ and $\Delta Q$, that is, by the output of the summation member 15, in a division element 16. By multiplying, in a multiplier 17, the quotient generated in element 16 by the length PQ of the transmission line, a measure is obtained of the distance PF between station P and the fault point F.

If the arguments for the impedance of the sources are different from each other to such an extent that the general method for obtaining $\Delta P$ and $\Delta Q$, described above, must be resorted to, three values have to be transferred from one station to the other, as mentioned above. If the evaluation of $\Delta P$ and $\Delta Q$ is to take place in station P, it is the voltage differences in the Q station, that is, the values given by equations (42), (43) and (44) that have to be transferred to station P.

The description of the method according to the invention for evaluation of $\Delta P$ and $\Delta Q$ in the general case has been based on the zero sequence voltage change according to equations (25) to (56). As also mentioned above, in addition to zero sequence voltages, the evaluation is also valid for negative sequence voltages, phase voltages and principal voltages. In order to show that any one of these voltage differences can be used, in the description of the following embodiment of the general method all references to zero sequence or negative sequence voltage, phase voltage and principal voltage has been omitted. Thus, this embodiment will be described using the following equations:

$$|\Delta U_{Pp}| = |U'_P - U''_P| = a_p \qquad (1')$$

$$|U_{Qq}| = |U'_Q - U''_Q| = a_q \qquad (2')$$

$$|\Delta U_{Pq}| = |U'_{Pq} - U''_{Pq}| = b_p \qquad (3')$$

$$|\Delta U_{Qp}| = |U'_{Qp} - U''_{Qp}| = b_q \qquad (4')$$

$$|\Delta U_{Ppq}| = |\Delta U_{Pq} - \Delta U_{Pp}| = c_p \qquad (57)$$

$$|\Delta U_{Qqp}| = |\Delta U_{Qp} - \Delta U_{Qq}| = c_q \qquad (58)$$

Figure 13:
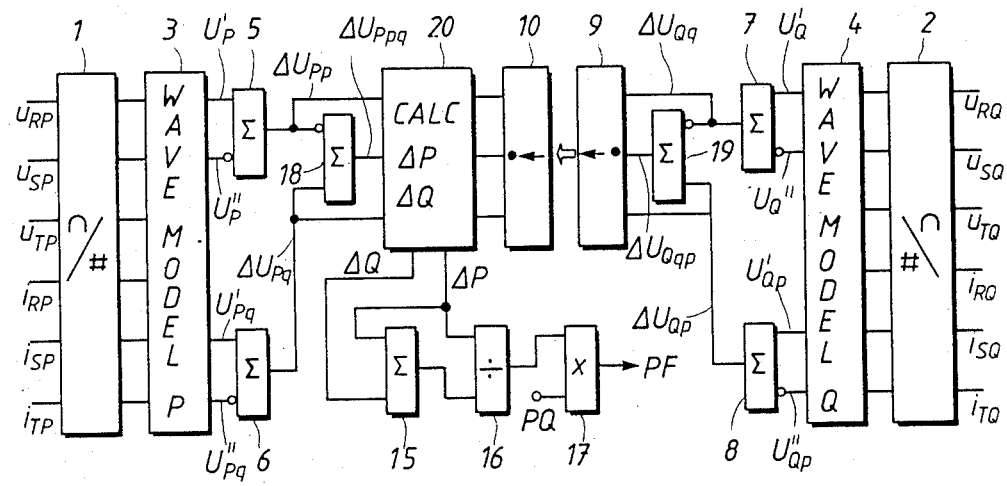
FIG. 13 shows an embodiment of a device according to the invention for location of a ground fault when the complex impedances of the power sources and the line may have arguments of different value.

This embodiment uses the arrangement shown in FIG. 13 which is similar to FIG. 12 but includes a calculator 20 and is supplemented by summation devices 18 and 19 for generating $c_p$ and $c_q$ from equations (57) and (58). Transmitter 9 and receiver 10 now transmit three measured values $a_q$, $b_q$ and $c_q$, which together with $a_p$, $b_p$ and $c_p$ are supplied to the calculator 20 for evaluating $\Delta P$ and $\Delta Q$. The calculation of the fault distance PF then takes place in the same way as described with reference to FIG. 12.

Figure 14:
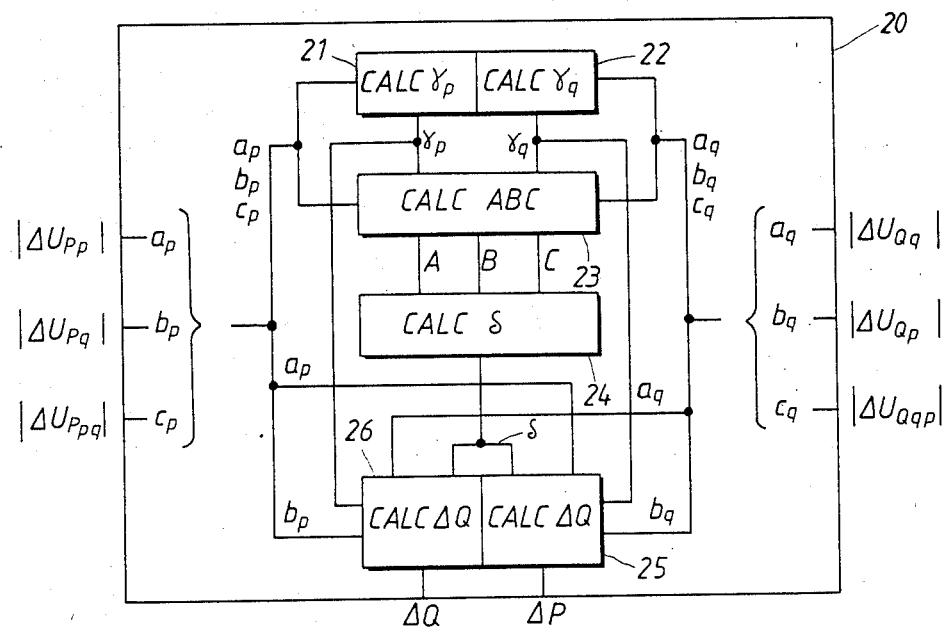
FIG. 14 shows an embodiment according to the invention of a flow diagram for evaluation of auxiliary quantities ΔP and ΔQ for calculating the fault distance.

FIG. 14 shows a flow diagram for the calculator 20. It includes devices 21 and 22 for calculating $\gamma_p$ and $\gamma_q$, device 23 for calculating the auxiliary quantities A, B and C, device 24 for calculating $\delta$ and devices 25 and 26 for final calculation of $\Delta P$ and $\Delta Q$.

Figure 15:
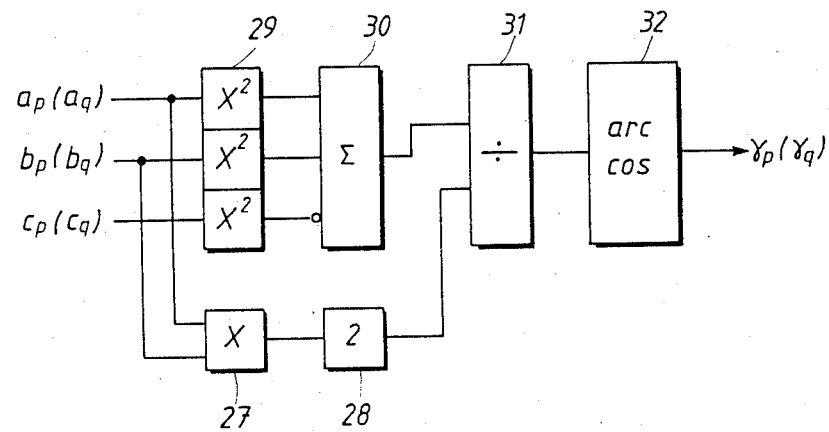
FIG. 15 shows an embodiment for evaluating auxiliary quantities $\gamma_p$ and $\gamma_q$.

The calculating devices 21–26 undertake simple mathematical operations which can be carried out in many different ways. In principle, the calculating devices 21 and 26 for calculating $\gamma_p$ and $\gamma_q$ according to equation (44) can be designed as shown in FIG. 15 with multipliers 27 and 28, elements for squaring, 29, summation, 30, division, 31, and a unit for generating the angle by the arccosine function (arccos), 32.

Figure 16:
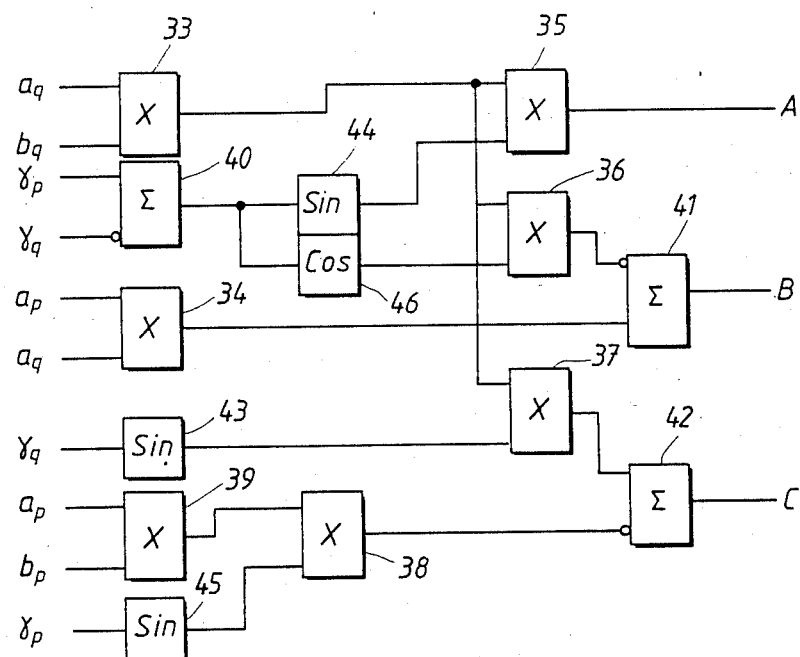
FIG. 16 shows an embodiment for evaluating auxiliary quantities A, B and C.

The device 23 for calculating the auxiliary quantities A, B and C according to equations (47), (48) and (49) may, in principle, be designed as shown in FIG. 16 comprising multipliers 33 to 39, summation devices 40, 41 and 42, elements 43, 44 and 45 for sine generation and element 46 for cosine generation.

Figure 17:
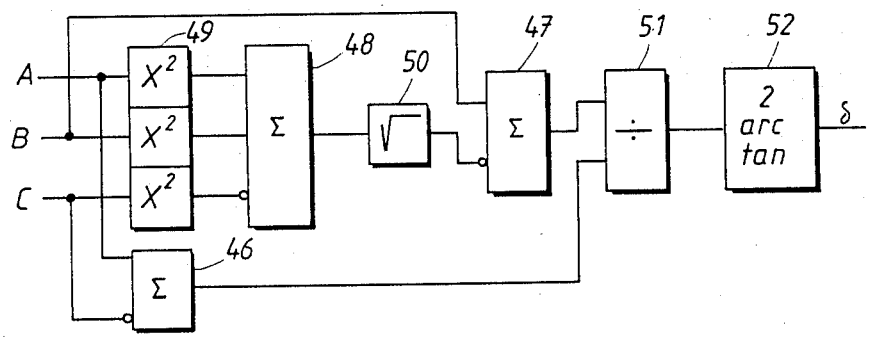
FIG. 17 shows an embodiment for evaluating auxiliary quantity δ.

The device 24 for calculating the angle $\delta$ according to equation (52) can be designed as shown in FIG. 17 comprising elements for summation, 46, 47, 48, for squaring, 49, for generating the square root, 50, for division, 51, and for generating the angle by the arctan function, 52.

Figure 18:
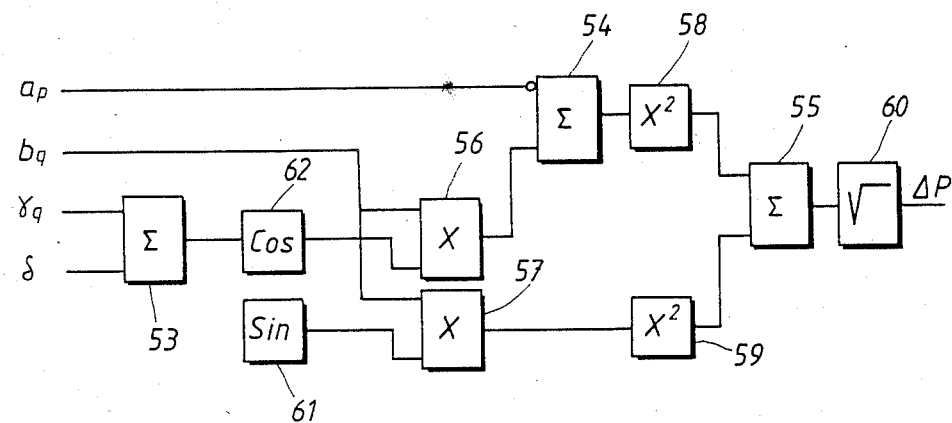
FIG. 18 shows an embodiment for evaluating ΔP with the aid of auxiliary quantities produced.

The device 52 for calculating $\Delta P$ according to equation (55) can be designed according to FIG. 18 comprising elements for summation, 53, 54 and 55, for multiplying, 56, 57, for squaring, 58, 59, for generating the square root, 60, and elements for sine generation, 61, and cosine generation, 62.

Figure 19:
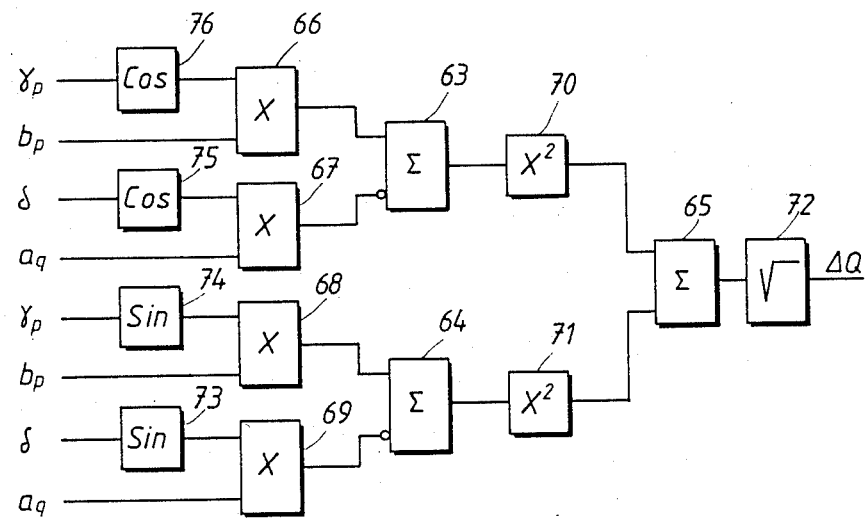
FIG. 19 shows an embodiment for evaluating ΔQ with the aid of auxiliary quantities produced.

The device 26 for calculating $\Delta Q$ according to equation (56) can be designed according to FIG. 19 comprising elements for summation, 63, 64, 65, for multiplying, 66, 67, 68, 69, for squaring, 70, 71, for generating the square root, 72, and elements for sine generation, 73, 74, and cosine generation, 75, 76.

In the embodiment of the fault location equipment which assumes approximately equal arguments for source impedance and line impedance as well as in the embodiment according to the general alternative as regards arguments, the components included, such as analog-digital converters, travelling wave models, summation device, comparison device, etc., can of course be designed as more or less integrated solutions based on modern analog or digital techniques.

As stated in the description of the method, alternative solutions to both alternative versions can be formed with a complete travelling wave model with the aid of which the voltage distribution along the whole transmission line between P and Q can be obtained, or with a simplified model which only gives the control voltage in the respective opposite station.

What is claimed is:

1. A method for locating a fault on an electrical power line extending between a first and a second station included in a power transmission system, in which at each end point of the line, measurement is made of the instantaneous values of the current flowing in the line and the voltage of the line, which values are converted into corresponding digital values and are supplied to each respective station to produce in accordance with a travelling wave model of the line the instantaneous voltage distribution along the transmission line, as seen from the first and from the second station, comprising:

determining the difference between the present line voltage and the line voltage at an immediately preceding time and when a fault is indicated by the difference exceeding a pre-set threshold value in either station, generating a first value in the first station representing the difference between the voltage in the second station, calculated in the travelling wave model in the first station with values of the currents and voltages measured in the first station and the corresponding voltage at an immediately preceding time, generating a similar second value in the second station for the first station using the travelling wave model in the second station, and transmitting one of said first and second values to the station in which it was not generated and used there in digital form to compute where the fault lies on the line relative to said station.

2. A method according to claim 1, wherein in each travelling wave model, the voltage distribution along the whole transmission line, as seen from the respective station, is calculated.

3. A method according to claim 1, wherein in each travelling wave model, only the voltage in the first and the second station is calculated.

4. A method according to claim 1, wherein the voltages delivered from the travelling wave models are generated as phase voltages.

5. A method according to claim 1, wherein the voltages delivered from the travelling wave models are generated as principal voltages.

6. A method according to claim 1, wherein voltages delivered from the travelling wave models are generated as negative or zero sequence voltages.

7. A method according to claim 1, wherein the step of determining includes producing a value $a_p = |\Delta U_{Pp}|$ as the difference between a voltage ($U'_P$), determined in the first station and a corresponding voltage ($U''_P$) one time unit earlier, and producing a value $a_q = |\Delta U_{Qq}|$ as the difference between a voltage ($U'_Q$), determined in the second station and a corresponding voltage ($U''_Q$) one time unit earlier, said first step of generating includes producing a value $b_p = |\Delta U_{Pq}|$ as the difference between a voltage ($U'_{Pq}$) in the second station, calculated in the travelling wave model in the first station with values of currents and voltages measured in the first station, and a corresponding voltage ($U''_{Pq}$) one time unit earlier, said second step of generating includes producing a value $b_q = |\Delta U_{Qp}|$ as the difference between a voltage ($U'_{Qp}$) in the first station, calculated in the travelling wave model in the second station with values of currents and voltages measured in the second station, and a corresponding voltage ($U''_{Qp}$) one time unit earlier, the computation of where the fault lies on the line includes producing a value $c_p$ as the vectorial difference between the voltages corresponding to $a_p$ and $b_p$, producing a value $c_q$ as the vectorial difference between the voltages corresponding to $a_q$ and $b_q$, determining a value $\Delta P$ as $$\sqrt{[b_q \cos(\gamma_q+\delta) - a_p]^2 + [b_q \sin(\gamma_q+\delta)]^2}$$

and determining a value Q as $$\sqrt{[b_p \cos\gamma_p - a_q \cos\delta]^2 + [b_p \sin\gamma_p - a_q \sin\delta]^2}$$

where
$\gamma_p = \arccos(a_p^2 + b_p^2 - c_p^2)/2a_pb_p$
$\gamma_q = \arccos(a_q^2 + b_q^2 - c_q^2)/2a_qb_q$
$\delta = 2 \arctan\{B \pm \sqrt{A^2 + B^2 - C^2}/(A-C)\}$
where
$A = b_pb_q \sin(\gamma_p - \gamma_q)$
$B = a_pa_q - b_pb_q \cos(\gamma_p - \gamma_q)$
$C = a_qb_q \sin\gamma_q - a_pb_p \sin\gamma_p$, and obtaining the distance between the first station and a fault point F on the transmission line between the first station and the second station with a mutual distance PQ as $$PF = \Delta P/(\Delta P + \Delta Q)PQ.$$

8. A method according to claim 7, wherein when the difference in argument between the complex impedances of the power sources and the transmission line is less than 10 degrees, $\Delta P$ and $\Delta Q$ are expressed, respectively, as $$\Delta P = \Delta U_{QP} - aU_{Pp}$$

and $$\Delta Q = \Delta U_{Pq} - \Delta U_{Qq}$$

9. A method according to claim 7, wherein the values of $a_p$, $b_p$, $c_p$ and $a_q$, $b_q$, $c_q$ represent one of the rectified mean value, the R.M.S. and the peak value of the corresponding voltages.

10. Equipment for determining the location of a fault on a power line between a first (P) and a second (Q) station included in a multi-phase power transmission system, comprising:

a first summation device to generate a difference voltage $a_p = |\Delta U_{Pp}|$ equal to the difference between a voltage ($U'_P$) determined in the first station, and a corresponding voltage ($U''_P$) one time unit earlier, a second summation device to generate a difference voltage $a_q = |\Delta U_{Qq}|$ equal to the difference between a voltage ($U'_Q$), determined in the second station and a corresponding voltage ($U''_Q$) one time unit earlier, a third summation device to generate a difference voltage $b_p = |\Delta U_{Pq}|$ equal to the difference between a voltage ($U'_{Pq}$) in the second station, calculated in the travelling wave model in the first station with values of voltages and currents measured in the first station, and a corresponding voltage ($U''_{Pq}$) one time unit earlier, a fourth summation device to generate a difference voltage $b_q = |\Delta U_{Qp}|$ equal to the difference between a voltage ($U'_{Qp}$) in the first station, calculated in the travelling wave model in the second station with values of voltages and currents measured in the second station, and a corresponding voltage ($U''_{Qp}$) one time unit earlier, a fifth summation device to generate the vectorial difference $c_p$ between the voltages corresponding to $a_p$ and $b_p$, a sixth summation device to generate the difference $c_q$ between the voltages corresponding to $a_q$ and $b_q$, means to transmit the difference voltages $a_q$, $b_q$ and $c_q$ from the second station Q to the first station P, means to supply the difference voltages $a_p$, $b_p$ and $c_p$ together with the values of $a_q$, $b_q$ and $c_q$ transmitted to the first station, to a calculator, the calculator calculates $$\Delta P = \sqrt{[b_q\cos(\gamma_q + \delta) - a_p]^2 + [b_q\sin(\gamma_q + \delta)]^2}$$

and $$\Delta Q = \sqrt{[b_p\cos\gamma_p - a_q\cos\delta]^2 + [b_p\sin\gamma_p - a_q\sin\delta]^2}$$

where 
$$\gamma_p = \arccos \frac{a_p^2 + b_p^2 - c_p^2}{2a_p b_p}$$

$$\gamma_q = \arccos \frac{a_q^2 + b_q^2 - c_q^2}{2a_q b_q}$$

$$\delta = 2 \arctan\left[\frac{B \pm \sqrt{A^2 + B^2 - C^2}}{A - C}\right]$$

in which $A = b_q b_p \sin(\gamma_p - \gamma_q)$
$B = a_p a_q - b_p b_q \cos(\gamma_p - \gamma_q)$
$C = a_q b_q \sin \gamma_q - a_p b_p \sin \gamma_p$ a seventh summation device to generate the sum of $\Delta P$ and $\Delta Q$, means to generate the quotient between $\Delta P$ and the sum of $\Delta P$ and $\Delta Q$, and means to obtain a measure of the distance PF between the first station and a fault point F on the transmission line between the first and the second stations with a mutual distance PQ by multiplying PQ by said quotient between $\Delta P$ and $\Delta P$ plus $\Delta Q$.

11. Equipment according to claim 10, wherein when the difference in argument between the complex impedances of the power sources and the transmission line is smaller than 10 degrees, $\Delta P$ is generated in an eighth summation device as the difference between $\Delta U_{Qp}$ and $\Delta U_{Pp}$, and $\Delta Q$ is generated in a ninth summation device as the difference between $\Delta U_{Pq}$ and $\Delta U_{Qq}$.

* * * * *